United States Patent [19]

Moreau

[11] Patent Number: 5,072,180
[45] Date of Patent: Dec. 10, 1991

[54] TEMPERATURE COMPENSATED METHOD AND APPARATUS FOR DETECTING THE OSCILLATION OF A RESONANT CIRCUIT TO DETERMINE DISTANCE OR PROXIMITY

[75] Inventor: Jean-Michel Moreau, Grenoble, France

[73] Assignee: SGS-Thomson Microelectronics S.A., Gentilly, France

[21] Appl. No.: 531,724

[22] Filed: Jun. 1, 1990

[30] Foreign Application Priority Data

Jun. 2, 1989 [FR] France .................................. 89 07820

[51] Int. Cl.$^5$ .............................. G01B 7/14; H03L 1/02
[52] U.S. Cl. .......................... 324/207.12; 324/207.16; 324/207.26; 324/236; 331/66
[58] Field of Search ..................... 324/207.12, 207.16, 324/207.26, 225, 234, 236, 327; 331/65, 66, 176; 307/116; 361/179, 180

[56] References Cited

U.S. PATENT DOCUMENTS

| | | |
|---|---|---|
| 3,328,680 | 6/1967 | Singer . |
| 4,509,023 | 4/1985 | Heimlicher ........................ 331/176 |
| 4,731,578 | 3/1988 | Tsaprazis ....................... 324/225 X |
| 4,797,614 | 1/1989 | Nelson .............................. 324/236 |
| 4,954,776 | 9/1990 | Husher .......................... 324/207.16 |
| 4,956,606 | 9/1990 | Kwiatkowski et al. ... 324/207.16 X |

FOREIGN PATENT DOCUMENTS

3322701A1 1/1985 Fed. Rep. of Germany .
3513403A1 10/1986 Fed. Rep. of Germany .

OTHER PUBLICATIONS

*PATENT ABSTRACTS OF JAPAN*, vol. 11, No. 223, (containing Japanese Patent Application No. 63-38382 (A), 1987) (No full English translation).

Primary Examiner—Gerard R. Strecker
Attorney, Agent, or Firm—Lowe, Price, LeBlanc & Becker

[57] ABSTRACT

A compensated temperature distance detector wherein the detecting coil is realized in the form of wires, divided and isolated the one from the others. A first set of wires (L) constitutes the oscillating coil parallel connected to a capacitor and fed between two distinct voltages (VCC and M) through a current source (IB) and a second set of wires (L'), connected at a first extremity to a first set of wires and to a generator, is connected at its other extremity to a third voltage (V1), whereby a d.c. current flows through the series connection of the first and second sets of wires.

8 Claims, 1 Drawing Sheet

TEMPERATURE COMPENSATED METHOD AND APPARATUS FOR DETECTING THE OSCILLATION OF A RESONANT CIRCUIT TO DETERMINE DISTANCE OR PROXIMITY

BACKGROUND OF THE INVENTION

The present invention relates to the field of distance detectors and proximity sensors.

Conventionally, a proximity detector comprises an oscillating circuit with a coil and capacitor, the Q factor of which depends upon the distance between the coil and a movable metal part constituted by the object whose distance to the coil is to be detected or by a metal part associated with the movement of this object. Various devices are provided for measuring the variation of the Q factor, by detecting the amplitude variation of the oscillations or by causing those oscillations to stop when a critical distance is reached.

As explained in detail in the European Patent Application EP-A-0 070 796 in the name of company Siemens AG, those proximity detectors are very sensitive to temperature variations, which substantially reduces their detection capability if no compensation step is taken.

Thus, this document EP-A-0 070 796 discloses a process for permitting the oscillation amplitude of the resonant circuit to remain constant whatever the temperature variation may be.

This process is described in relation to FIG. 1 and consists of using an a.c. current source $I_B$ at a resonance frequency and constant amplitude. Current flows from terminal B to terminal A of a resonant circuit constituted by a winding L and a capacitor C and through an inductor L, the second terminal of which is connected to a point D. Windings L and L' are in fact constituted by separate windings of the same coil divided and isolated one from the other. Thus, when a current flows between terminals B and D passing through windings L and L', the latter being considered as a pure resistance, the inductive effects are compensated for, due to the high coupling between the windings. When a temperature variation occurs, the resistance of winding L increases, the Q factor of the oscillating circuit therefore decreases, that is, the amplitude of the oscillations decreases. But simultaneously, the voltage across L, that is, across the oscillating circuit, increases since it is equal to the resistance of L multiplied by current from $I_B$ and this resistance has increased. Consequently, the decrease of the Q factor is compensated for by the increase of the voltage across the terminals and the oscillation amplitude of the resonant circuit remains substantially constant even though the temperature varies. Therefore, a resonant circuit supplying oscillations having substantially constant amplitude independent of temperature variations has been achieved.

However, a problem is encountered when it is desired to use such a circuit as a proximity detector or as a distance detector. Indeed, the resistance that has been hitherto considered as being the resistance of winding L is in fact the equivalent parallel resistance of the resonant circuit at the oscillation frequency. This equivalent resistance depends upon the coupling factor of the coil with a metal part, the displacement of which is to be detected. Thus, the above described circuit tends to supply oscillations of constant amplitude not only when the temperature varies but also when the aforementioned coupling factor varies. Therefore, this circuit will exhibit little sensitivity as a proximity detector since it tends to compensate for the phenomenon it is desired to detect. In any case, it does not permit an indication on distance variations between a metal part and the coil.

Thus, an object of the present invention is to provide a distance detector, usable as a proximity detector, independent of temperature variation effects.

BRIEF SUMMARY OF THE INVENTION

In order to attain this object, while using the process described in the aforementioned document, providing compensation for the oscillation amplitude by taking into account the variations of the a.c. coil winding resistance, the invention detects the d.c. coil resistance. This d.c. detection depends only upon temperature effects and not upon the coupling of the windings. This D.C. information is used for correcting a detection signal corresponding to the output voltage of the oscillating circuit, the oscillation amplitude of which is not stabilized for temperature variations.

BRIEF DISCLOSURE OF THE DRAWINGS

The foregoing and other objects, features and advantages of the invention will be apparent from the following detailed description of preferred embodiments as illustrated in the accompanying drawings wherein:

FIG. 1, designed to explain the state of the prior art, is described above;

FIG. 2 schematically shows a circuit according to the invention as applied to a proximity detector; and FIG. 3 illustrates a variant of the circuit according to the invention used as a distance detector.

DETAILED DESCRIPTION OF THE INVENTION

Figure 1:
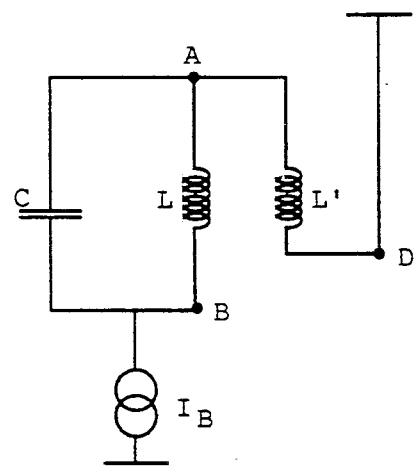
Figure 2:
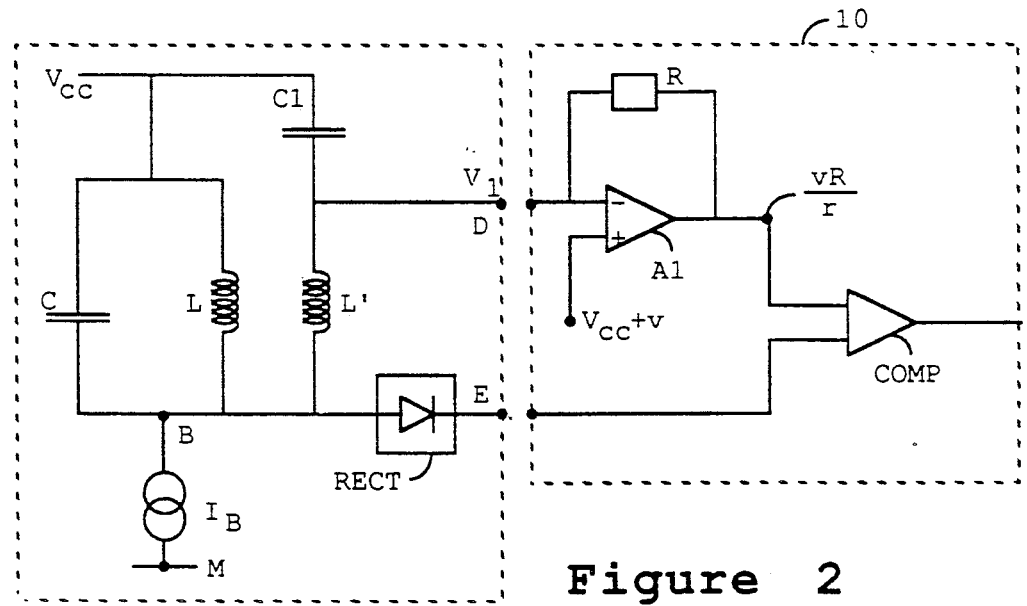

As shown in FIG. 2, a circuit according to the invention comprises an a.c. current source $I_B$ having a constant amplitude connected between a first constant voltage M and a second constant voltage VCC. The current flows through an oscillating circuit comprising a capacitor C and a winding L included as part of a coil of a proximity detector. This coil is constituted by windings, divided and isolated one from the other to form in addition to winding L a winding L' connected to winding L at its connection point B with the current source. The other terminal of winding L' is connected to terminal D having a floating voltage V1. Thus, a d.c. current flows from potential VCC to node D having potential V1, passing through the series windings L and L'. Due to the very high coupling value between the two windings, there is substantially no a.c. current flowing from potentials VCC to node D when passing through series windings L and L'. In order to avoid the occurrence of any parasitic a.c. voltage, it is possible to interconnect the extremities of windings L and L' through an optional capacitor C1 having an appropriate value. This capacitor C1 further permits a parallel connection, for a.c. current of winding L' with winding L and therefore does not impair the Q factor.

On the other hand, the signal at termainal B of the oscillating circuit is detected by a rectifier RECT and is available on a terminal E.

As above described, the variation of the d.c. resistance in windings L and L' is usable according to the invention for compensating the signal fluctuations on terminal E as regards temperature.

Block 10 represents an exemplary circuit ensuring this function in connection with a proximity detector, that is, a circuit indicating whether an object to be detected is within or outside a predetermined distance with respect to the coil. Circuit 10 comprises an operational amplifier A1, the non-inverting input of which is connected to a reference voltage VCC+v and the output of which is connected to the inverting input through a high value resistor R. This inverting input is also connected to terminal D of winding L'. Thus, there is between the inverting input and potential VCC a resistance r corresponding to the sum of the d.c. resistances of windings L and L'. Amplifier A1 supplies a voltage equal to $v(1+R/r)$, that is, about $vR/r$ in case R is chosen substantially higher than r. The output voltage therefore varies as the inverse value of the resistance (in d.c. current) of the coil.

On the other hand, the oscillating circuit voltage is proportional to the Q factor of this oscillating circuit that can be expressed by $Q=2\pi fL/R_{Cu}$, f being the tuning frequency, L the inductance of the coil and $R_{Cu}$ the a.c. resistance of the coil at resonance. The signal on terminal E is proportional to this value and is sent onto a first terminal of a comparator COMP, the second terminal of which receives the output of the operational amplifier A1.

If the temperature varies, the value of $R_{Cu}$ and the oscillation amplitude vary; similarly, the value of r and therefore the reference voltage $vR/r$ at the second input of comparator COMP vary in the same direction. Therefore, it is clear that by properly selecting the values of v and R, an appropriate temperature correction is achieved.

If the coupling factor, that is, the distance between the object to be detected and the coil, varies, the amplitude of the oscillating circuit oscillations varies and the rectified voltage on terminal E varies accordingly but the value of r which corresponds to a d.c. detection of the resistances of windings L and L' does not vary. Therefore, it is possible to carry out a simple detection at the output of comparator COMP and to set the triggering distance by causing voltage v, resistance R and current from IB to vary as a function of the chosen distance.

As the invention provides a reference signal depending upon the temperature only and not upon other variation parameters of the Q factor of a detecting coil, it is possible to apply the invention not only to a proximity detector supplying a binary response but also to distance detector supplying a substantially linear information on the distance between a coil and a metal part.

Figure 3:
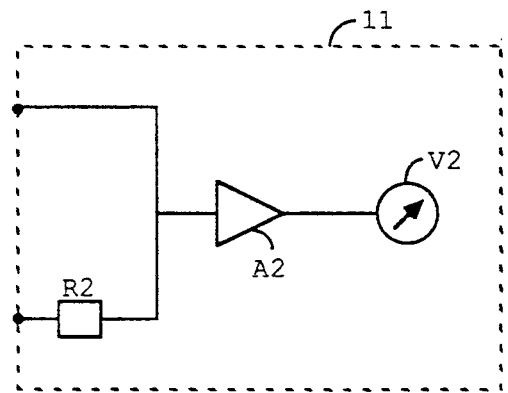

To attain this object, it will be possible to replace in FIG. 2 block 10 by block 11 of FIG. 3. Block 11 comprises a resistor R2 connected to the input of an amplifier A2, the output of which is connected to a measurement means such as an analog voltmeter V2. The input of amplifier A2 is also connected to terminal D of FIG. 2. In this circuit, considering the path of the d.c. current, the voltage on terminal E is applied to a potentiometer comprising on a leg a resistor R2 and on the other leg the sum r of resistances of windings L and L' connected to voltage VCC. Since resistance r varies with the temperature as voltage VE (VE being referenced VCC) on terminal E, this temperature variation can be fully compensated and voltmeter V2 supplies an indication independent of the temperature. This indication is characteristic of the equivalent impedance variation of the oscillating circuit as a function of the coupling factor. As this is known by those skilled in the art, this indication is substantially linear, at least within the operation range. Voltmeter V2 can therefore be graduated to directly indicate target distances.

In order to obtain a satisfactory temperature compensation, it will be necessary to choose $R2 >> r$ since the voltage across r is equal to $VE[r/(r+R2)]$ and it therefore becomes substantially equal to $VE[r/R2]$ (proportional to r).

Those skilled in the art will be able to devise other applications of the process for compensating the output signal temperature of a resonant circuit. More specifically, in the embodiments described in the invention, the compensation signal corresponding to the d.c. resistance of a resonant circuit coil is used in relation with the rectified output signal of the resonant circuit. This choice of an application to the rectified signal is made for the sake of simplicity but does not constitute a limitation to the invention.

Furthermore, it is possible to add to the circuit of the invention the improvements generally incorporated in the proximity detectors.

I claim:

1. A method of generating from a resonant circuit having a coil and driven by a constant amplitude signal generator, a temperature compensated output signal indicative of the presence of an object to be detected in proximity to said coil, comprising the steps of:
    (a) supplying a constant alternating current to said resonant circuit from said constant amplitude signal generator;
    (b) passing a direct current through said coil;
    (c) obtaining a first temperature dependent signal using the direct current passing through said coil;
    (d) obtaining a second temperature dependent signal using an AC output of said resonant circuit driven by said constant amplitude signal generator;
    (e) comparing said first and second temperature dependent signals; and
    (f) providing from the comparison of said first and second temperature dependent signals said temperature compensated output signal when a non-temperature dependent change occurs in said second temperature dependent signal in response to an object in proximity to said coil.

2. The method of claim 1, further comprising the step of rectifying said second temperature dependent signal before the step of comparing said first and second temperature dependent signals.

3. The method of claim 1, further comprising the step of inverting said first temperature dependent signal before comparing said first and second temperature dependent signals.

4. A temperature compensated distance detector driven by a constant amplitude signal generator, comprising:
    a capacitor;
    a wire coil divided into two segments, each segment being isolated from the other, wherein said first segment is connected in parallel with said capacitor to form a resonant circuit between a first node and a second node, said resonant circuit being fed at said first node by a first source of DC potential and at said second node by said constant amplitude signal generator, and wherein one end of said second segment is connected to said second node of said resonant circuit and said constant amplitude signal generator and another end is connected to a third node having a third potential to establish a direct current path from said first source of potential through said first and second segments to said third node, whereby a temperature dependent DC signal is output from said third node and a temperature dependent AC signal is output from said second node.

5. The temperature compensated distance detector of claim 4, further comprising means for rectifying a signal derived from said second node.

6. The temperature compensated distance detector of claim 5, further comprising a comparator having a first input receiving said signal derived from said second node and a second input receiving a signal derived from said third node.

7. The temperature compensated distance detector of claim 6, further comprising an operational amplifier for processing said signal derived from said third node.

8. The temperature compensated distance detector of claim 5, further comprising an amplifier having a first input connected to the output of said rectifying means and a second input connected to said third node; and a measurement device connected to the output of said amplifier.

* * * * *